United States Patent
Shin et al.

(10) Patent No.: US 7,727,875 B2
(45) Date of Patent: Jun. 1, 2010

(54) GROOVING BUMPED WAFER PRE-UNDERFILL SYSTEM

(75) Inventors: Junghoon Shin, Choongbook (KR); Sungyoon Lee, Inchon-si (KR); Taewoo Lee, Kyounggi (KR)

(73) Assignee: STATS ChipPAC, Ltd., Singapore (SG)

( * ) Notice: Subject to any disclaimer, the term of this patent is extended or adjusted under 35 U.S.C. 154(b) by 241 days.

(21) Appl. No.: 11/766,710

(22) Filed: Jun. 21, 2007

(65) Prior Publication Data
US 2008/0318396 A1  Dec. 25, 2008

(51) Int. Cl.
*H01L 21/44* (2006.01)
(52) U.S. Cl. .............. 438/613; 438/113; 438/114; 438/108; 438/E21.503
(58) Field of Classification Search .............. 438/33, 438/68, 108–114, 460, 613, 462–465
See application file for complete search history.

(56) References Cited

U.S. PATENT DOCUMENTS

| | | | |
|---|---|---|---|
| 6,023,094 A | 2/2000 | Kao et al. | |
| 6,175,162 B1 | 1/2001 | Kao et al. | |
| 6,649,445 B1* | 11/2003 | Qi et al. | 438/108 |
| 6,676,491 B2 | 1/2004 | Arai et al. | |
| 6,794,751 B2 | 9/2004 | Kumamoto | |
| 2002/0137309 A1 | 9/2002 | Senoo et al. | |
| 2005/0003636 A1 | 1/2005 | Takyu et al. | |
| 2005/0142837 A1* | 6/2005 | Tsai et al. | 438/613 |
| 2005/0148160 A1 | 7/2005 | Farnworth et al. | |

* cited by examiner

*Primary Examiner*—Dung A. Le
(74) *Attorney, Agent, or Firm*—Robert D. Atkins

(57) ABSTRACT

A method of forming a semiconductor device includes providing a bumped wafer. A plurality of grooves is formed in an active surface of the bumped wafer. A pre-underfill layer is disposed over the active surface, filling the plurality of grooves. A first adhesive layer is mounted to the pre-underfill layer, and a back surface of the bumped wafer is ground. A second adhesive layer is mounted to the back surface of the bumped wafer. The first adhesive layer is peeled from the active surface of the bumped wafer, or the second adhesive layer is mounted to the first adhesive layer. The bumped wafer is singulated into a plurality of segments by cutting the bumped wafer along the plurality of grooves.

21 Claims, 7 Drawing Sheets

GROOVING BUMPED WAFER PRE-UNDERFILL SYSTEM

FIELD OF THE INVENTION

The present invention relates in general to electronic devices and, more particularly, to a method of forming a semiconductor device utilizing a pre-underfill material disposed over a bumped wafer structure.

BACKGROUND OF THE INVENTION

Semiconductors, or computer chips, are found in virtually every electrical product manufactured today. Semiconductors are used not only in sophisticated industrial and commercial electronic equipment, but also in many household and consumer items such as televisions, clothes washers and dryers, radios, and telephones. As products become smaller but more functional, there is a need to include more semiconductors in the smaller products to perform the functionality. The reduction in size of cellular telephones is one example of how more capabilities are incorporated into smaller electronic products.

A so-called "flip chip" is generally a monolithic semiconductor device, such as an integrated circuit, having bead-like terminals formed on one surface of the chip. The terminals serve to both secure the chip to a circuit board and electrically connect the flip chip's circuitry to a conductor pattern formed on the circuit board, which may be a ceramic substrate, printed wiring board, flexible circuit, or a silicon substrate. Due to the numerous functions typically performed by the micro-circuitry of a flip chip, a relatively large number of terminals are required.

Because of the fine patterns of the terminals and conductor pattern, soldering a flip chip to its conductor pattern requires a high degree of precision. Reflow solder techniques are widely utilized in the soldering of flip chips. Such techniques typically involve forming solder bumps on the surface of the flip chip using methods such as electrodeposition, by which a quantity of solder is accurately deposited on one surface of the flip chip. Heating the solder above its melting temperature serves to form the characteristic solder bumps. The chip is then soldered to the conductor pattern by registering the solder bumps with their respective conductors, and reheating, or reflowing, the solder so as to metallurgically and electrically bond the chip to the conductor pattern.

In flip chip packaging and other semiconductor devices, a so-called "underfill" material is provided between the substrate and the die to promote device reliability characteristics. Various methods are known in the art for depositing the underfill material, including deposition through an opening of the substrate so as to fill in a gap between the substrate and the die. More recently, techniques involving the application of a film to a bumped wafer have been utilized.

Shortcomings associated with the current art remain. For example, removal of a film material from the bumped wafer can cause damage to the characteristic solder bumps. In addition, conventional techniques making use of bumped wafer structures often result in chipping and cracking during a subsequent die attach or chip attach process.

SUMMARY OF THE INVENTION

A need exists for a method of forming a semiconductor device utilizing a bumped wafer structure, where the thickness of the bumped wafer structure can be under 100 micrometers (um), which is increasingly in demand for particular applications, without the bumped wafer chipping or cracking, particularly during a subsequent die attach or chip attach process.

Accordingly, in one embodiment, the present invention is a method of forming a semiconductor device comprising providing a bumped wafer, forming a plurality of grooves in an active surface of the bumped wafer, disposing a pre-underfill layer over the active surface, filling the plurality of grooves, mounting a first adhesive layer to the pre-underfill layer, and grinding a back surface of the bumped wafer, mounting a second adhesive layer to the back surface of the bumped wafer and peeling off the first adhesive layer from the active surface of the bumped wafer, or mounting the second adhesive layer to the first adhesive layer, and singulating the bumped wafer into a plurality of segments by cutting the bumped wafer along the plurality of grooves.

In another embodiment, the present invention is a method of forming a semiconductor device comprising providing a bumped wafer, forming a plurality of grooves in an active surface of the bumped wafer, disposing a pre-underfill layer over the active surface, filling the plurality of grooves, laminating a first adhesive layer to the pre-underfill layer, and grinding a back surface of the bumped wafer, disposing a coating over the back surface of the bumped wafer, mounting a second adhesive layer to the coating and peeling off the first adhesive layer from the active surface of the bumped wafer, or mounting the second adhesive layer to the first adhesive layer, and singulating the bumped wafer into a plurality of segments by cutting the bumped wafer along the plurality of grooves.

In another embodiment, the present invention is a method of manufacturing a semiconductor device comprising providing a bumped wafer having a plurality of grooves formed in an active surface of the bumped wafer, providing a pre-underfill layer disposed over the active surface, filling the plurality of grooves, providing a first adhesive layer mounted to the pre-underfill layer, and providing a second adhesive layer mounted to a back surface of the bumped wafer, or mounted to the first adhesive layer.

In still another embodiment, the present invention is a method of manufacturing a semiconductor device comprising providing a bumped wafer having a plurality of grooves formed in an active surface of the bumped wafer, providing a pre-underfill layer disposed over the active surface, filling the plurality of grooves, providing a coating disposed over a back surface of the bumped wafer, providing a first adhesive layer mounted to the pre-underfill layer, and providing a second adhesive layer mounted to the coating, or mounted to the first adhesive layer.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
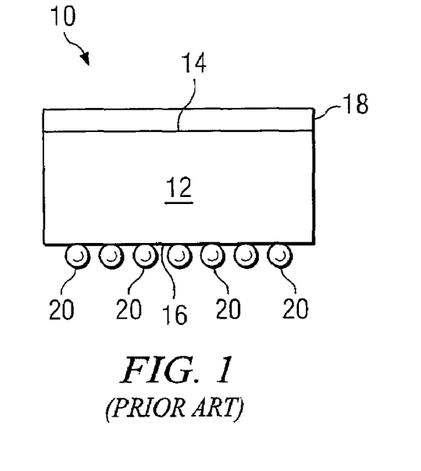
FIG. 1 illustrates an exemplary prior art semiconductor wafer having a bottom surface protective coating.

FIG. 1 illustrates an exemplary prior art semiconductor flip chip device 10, having a die 12 with a bottom surface 14 and a top surface 16. A dicing saw tape 18 is adhered directly to bottom surface 14 as shown. A plurality of bumps 20 are formed on the top surface 16 of die 12. Dicing saw tape 18 is intended to prevent chipping during a dicing process undergone by flip chip device 10.

Figure 2:
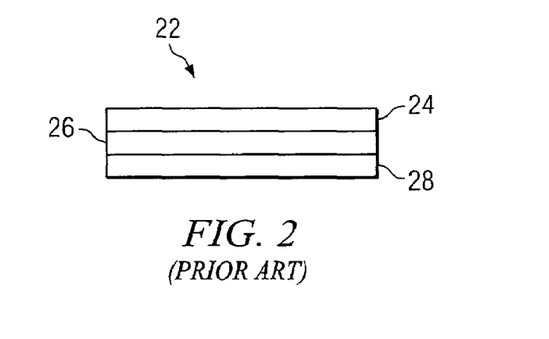
FIG. 2 illustrates an exemplary prior art sheet forming a protective film for semiconductor chips.

FIG. 2 illustrates a second exemplary prior art semiconductor device 22 including a bumped semiconductor wafer 24, a release layer 26, and a base film 28. Base film 28 is intended to eliminate adverse effects of mechanical grinding on the back surface of wafer 24, as well as to reduce chipping during subsequent dicing processes.

The present invention improves upon the techniques described in the prior art to enable the use of a thin, bumped wafer structure (e.g., less than 100 um thickness) without chipping or cracking during a subsequent dicing process, die attach process, and chip attach process.

Figure 3:
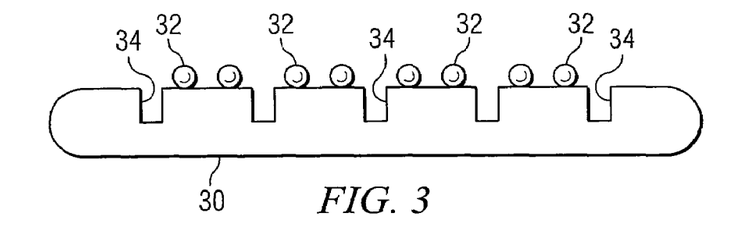
FIG. 3 illustrates a first step in a first exemplary method of forming a semiconductor device using a grooved bumped wafer structure and a pre-underfill material, showing a grooved bumped wafer structure.

Turning to FIG. 3, a first step in a first exemplary method of forming a semiconductor device, including a bumped wafer structure, is shown. A bumped wafer 30 has a plurality of bumps 32. The bumps 32 represent solder bumps, gold (Au) bumps, or copper (Cu) bumps. The bumped wafer 30 undergoes a dicing process to form a plurality of grooves 34 in the active surface of wafer 30 as depicted. The dicing process uses a diamond blade or laser.

Figure 4:
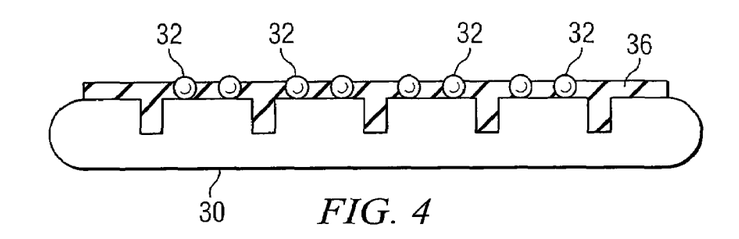
FIG. 4 illustrates a second step in the first exemplary method begun with FIG. 3, of forming a semiconductor device using a grooved bumped wafer structure and a pre-underfill material, showing the deposition of the pre-underfill material over the bumped wafer.

FIG. 4 depicts a second step in the first exemplary method begun with FIG. 3. A wafer-level pre-underfill material 36 is deposited over the active surface of wafer 30 as shown. The material 36 can include polyimide (Pi), thermoplastic resin, similar polymer and/or organic materials. Pre-underfill layer 36 can also include an epoxy or acryl materials having adhesive characteristics.

The material 36 can be deposited by spin-coating or screen printing methods. As seen, the material 36 provides an even coating over wafer 30. Each of the grooves 34 formed in the surface of wafer 30 is filled by pre-underfill material 36.

Figure 5:
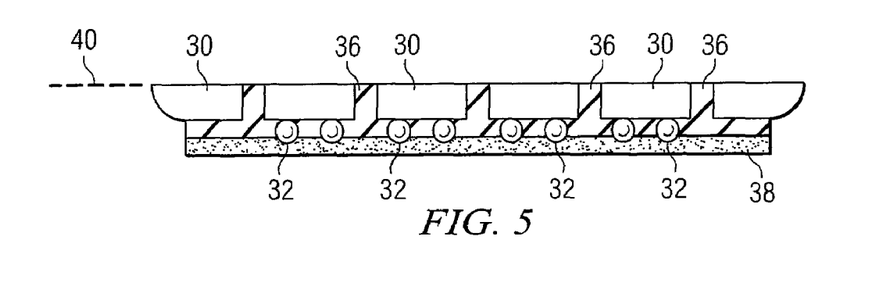
FIG. 5 illustrates a third step in the first exemplary method begun with FIG. 3, of forming a semiconductor device using a grooved bumped wafer structure and a pre-underfill material, showing the application of a first adhesive layer.

FIG. 5 illustrates a third step in the first exemplary method begun with FIG. 3. In the depicted step, a first adhesive material layer 38 is disposed on pre-underfill layer 36 as shown. The adhesive material 38 can include an adhesive, such as lamination tape. The adhesive layer 38 can include such materials as ultraviolet (UV) tape, thermoplastic resin, photo-resist, or other materials that have adhesive properties. In many cases, UV tape can be implemented to impart peeling convenience. The layer 38 can also be applied by a pressing operation. The wafer 30 is inverted and a backgrinding process using a grinding wheel is performed to the back surface 40 to reduce the thickness of wafer 30.

By performing a dicing operation to groove the wafer 30 prior to the backgrinding process depicted in FIG. 5, and by performing the deposition of the pre-underfill material 36 prior to the backgrinding process depicted in FIG. 5, wafer 30 is protected from chipping and cracking during a subsequent die attach or chip attach process. The adhesive material 38 attached to the pre-underfill material 36 provides structural support to wafer 30 during the backgrinding operation, which can result in a thinner wafer having less warping and other physical deficiencies.

Figure 6A:
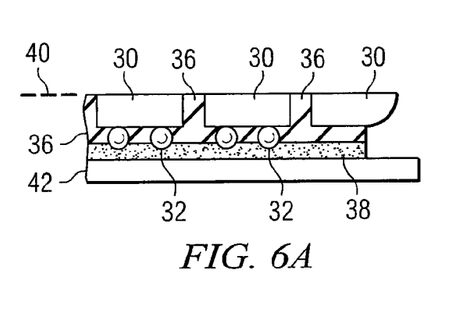
FIG. 6A illustrates a first option of a fourth step in the first exemplary method begun with FIG. 3, where a second adhesive layer is connected to the first adhesive layer.

FIG. 6A illustrates a first option for a fourth step in the exemplary method begun with FIG. 3. The first option involves applying a second adhesive layer 42 to the first adhesive layer 38. The second adhesive layer 42 can also include various adhesive materials such as lamination tape.

Figure 6B:
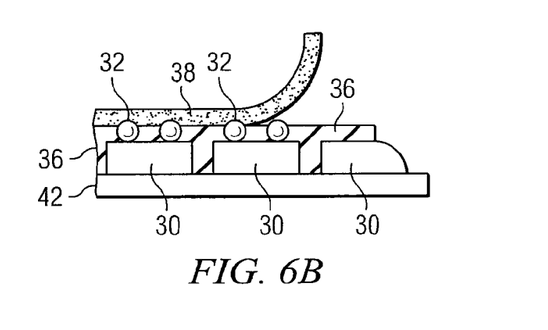
FIG. 6B illustrates a second option of the fourth step in the first exemplary method begun with FIG. 3, where the second adhesive layer is connected to a back surface of the bumped wafer.

Depicting an alternative approach, FIG. 6B illustrates the second adhesive layer 42 applied to the back surface of wafer 30. In the option depicted, the first adhesive layer 38 is removed from the pre-underfill layer 36 as shown. The layer 38 can be removed using a peeling process. The wafer 30 can be inverted prior to the removal step, as shown. In one embodiment, a portion of bumps 32 are exposed following the removal of layer 38.

Figure 7A:
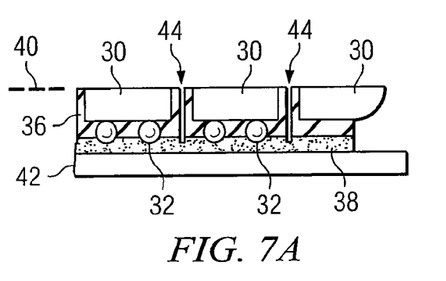
FIGS. 7A and 7B illustrate first and second options of a fifth step in the first exemplary method begun with FIG. 3, respectively, where the bumped wafer is singulated into a plurality of segments.
Figure 7B:
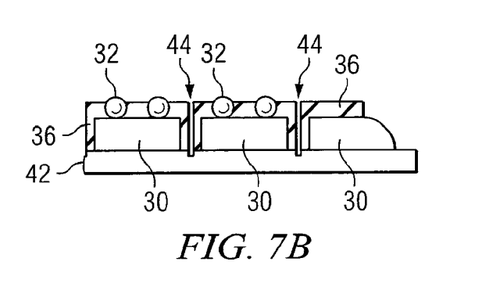

FIGS. 7A and 7B collectively illustrate the next, fifth step in the exemplary method begun with FIG. 3, for the case where adhesive layer 42 is mounted to adhesive layer 38, and for the case where adhesive layer 42 is mounted directly to wafer 30, respectively. In the case of layer 38 to layer 42 adhesion, FIG. 7A illustrates the dicing saw process of forming saw cuts 44 to correspond with each of the filled grooves 34 of bumped wafer 30. The cuts 44 can be formed with a dicing saw, or with similar manufacturing tool. As shown in FIG. 7A, the cuts extend to a portion of adhesive layer 38. Layer 42 is left uncut so as to collectively retain individual cut segments of wafer 30 and to continue to provide structural support as the segments of wafer 30 are moved.

Similarly, FIG. 7B illustrates the sawing process for the case where adhesive layer 42 is applied directly to the back side of wafer 30. Cuts 44 are oriented to correspond with each of the plurality of filled grooves 34 of the bumped wafer 30. The cuts 44 extend into a portion of the layer 42, but do not cut through the layer 42 entirely. Again, layer 42 continues to provide structural support and collectively holds the segments of wafer 30 in place.

Figure 8A:
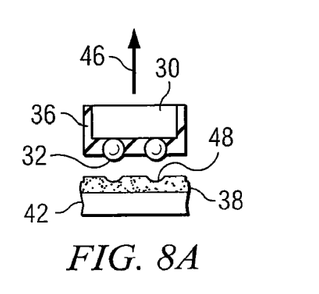
FIG. 8A illustrates a first option of a sixth step in the first exemplary method begun with FIG. 3, where a die attach process removes a bump from the bumped wafer segment.

Turning to FIG. 8A, a die attach process is shown in the case where layers 38 and 42 are directly attached. The die attach process can proceed using tools and processes known in the art. An individual segment of the plurality of segments of wafer 30 are shown for conceptual purposes of illustration. The segment 30 is lifted as denoted by arrow 46 from adhesive layers 38 and 42. The bumps 32 are protected by layers 38 and 42 prior to the die attach process, which leaves behind void 48 in layer 38.

Figure 8B:
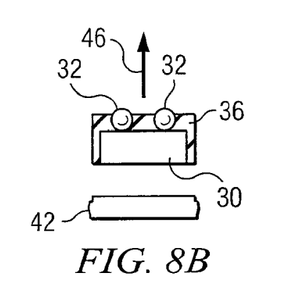
FIG. 8B illustrates a second option of the sixth step in the first exemplary method begun with FIG. 3, where a chip attach process removes the bumped wafer segment from the second adhesive layer.

In FIG. 8B, a chip attach process is shown which again lifts a segment of the bumped wafer 30, as denoted by arrow 46, to separate the segment from adhesive layer 42.

Figure 9:
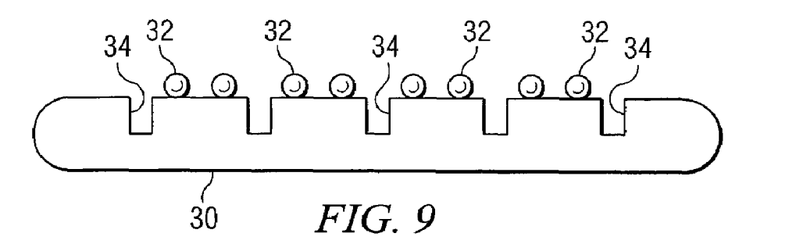
FIG. 9 illustrates a first step in a second exemplary method of forming a semiconductor device using a grooved bumped wafer structure and a pre-underfill material, showing a grooved bumped wafer structure.

Turning to FIG. 9, a first step in a second exemplary method of forming a semiconductor device, including a bumped wafer structure, is shown. The bumped wafer 30 has a plurality of bumps 32. Again, the bumps 32 represent solder bumps, gold (Au) bumps, or copper (Cu) bumps. The bumped wafer 30 undergoes a dicing process to form a plurality of grooves 34 in the active surface of wafer 30 as depicted.

Figure 10:
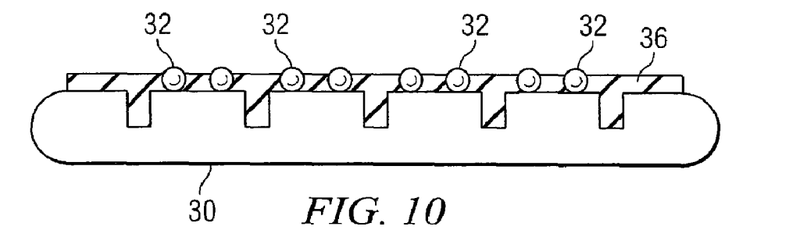
FIG. 10 illustrates a second step in the second exemplary method begun with FIG. 9, of forming a semiconductor device using a grooved bumped wafer structure and a pre-underfill material, showing the deposition of the pre-underfill material over the bumped wafer structure.

FIG. 10 depicts a second step in the second exemplary method begun with FIG. 9. Again, a wafer-level pre-underfill material 36 is deposited over the active surface of wafer 30 as shown. The material 36 can include polyimide (Pi), thermoplastic resin, similar polymer and/or organic materials. Pre-underfill layer 36 can also include an epoxy, or acryl materials having adhesive characteristics.

The material 36 can be deposited using spin-coating or screen printing methods. As seen, the material 36 provides an even coating over wafer 30. Each of the grooves 34 formed in the surface of wafer 30 is filled by the pre-underfill material 36.

Figure 11:
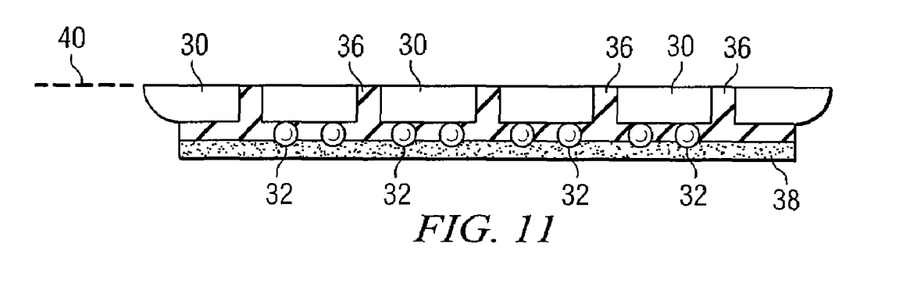
FIG. 11 illustrates a third step in the second exemplary method begun with FIG. 3, of forming a semiconductor device using a grooved bumped wafer structure and a pre-underfill material, where a first adhesive layer is connected to an active surface of the bumped wafer.

FIG. 11 illustrates a third step in the second exemplary method begun with FIG. 9. In the depicted step, a first adhesive material layer 38 is mounted to the pre-underfill layer as shown. Again, the adhesive material 38 can include an adhesive, such as a lamination tape. The adhesive layer 38 can include such materials as ultraviolet (UV) tape, thermoplastic resin, photo-resist, or other materials that have adhesive properties. In many cases, UV tape can be implemented to impart peeling convenience. The layer 38 can also be applied by a pressing operation.

The wafer 30 is inverted and a backgrinding process is performed to the back surface 40 to reduce the thickness of wafer 30 using a grinding wheel.

Here again, by performing a dicing operation to groove the wafer 30 prior to the backgrinding process depicted in FIG. 11, and by performing the deposition of the pre-underfill material prior to the backgrinding process depicted in FIG. 11, wafer 30 is protected from chipping and cracking during a subsequent die attach or chip attach process. The adhesive material 38 attached to the pre-underfill material 36 provides structural support to wafer 30 during the backgrinding operation, which can result in a thinner wafer having less warping and other physical deficiencies.

Figure 12:
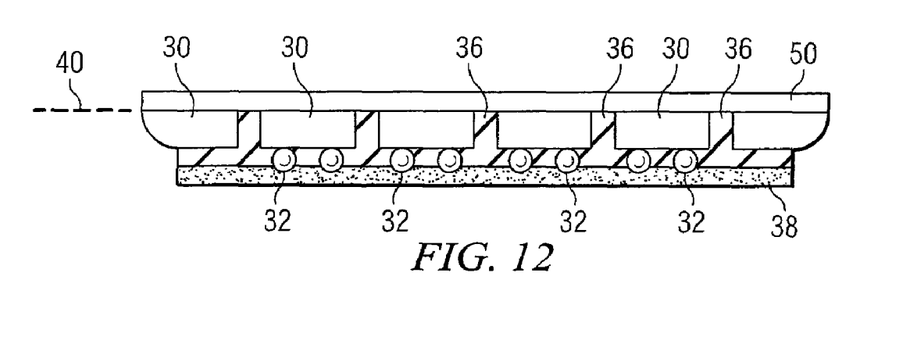
FIG. 12 illustrates a fourth step in the second exemplary method begun with FIG. 9, where a coating is disposed over the back surface of the bumped wafer.

FIG. 12 reflects an additional, fourth step to distinguish the present exemplary second method from the first exemplary method. A coating 50 is disposed over the back surface 40 of wafer 30 as shown. The coating can include such materials as polyimide (Pi), thermoplastic resin, organic materials, polymer materials, and similar materials. The coating can be deposited by a spin-coating process or a screen printing process. Coating 50 provides protection for the back surface 40 of wafer 30 and helps to protect wafer 30 from breakage or cracking, particularly during subsequent die attach or chip attach steps.

Figure 13A:
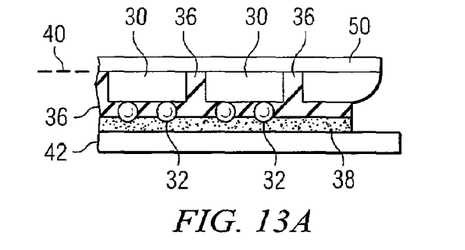
FIG. 13A illustrates a first option of a fifth step in the second exemplary method begun with FIG. 9, where a second adhesive layer is connected to the first adhesive layer.

FIG. 13A illustrates a first option for a fifth step in the exemplary method begun with FIG. 9. The first option involves disposing a second adhesive layer 42 onto the first adhesive layer 38. The second adhesive layer 42 can also include various adhesive materials such as lamination tape.

Figure 13B:
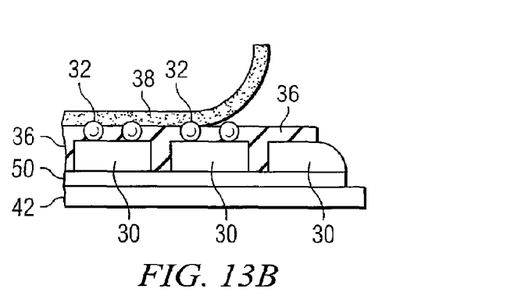
FIG. 13B illustrates a second option of the fifth step in the second exemplary method begun with FIG. 9, where the second adhesive layer is connected to the coating.

Depicting an alternative approach, FIG. 13B illustrates the second adhesive layer 42 applied to coating 50. In the option depicted, the first adhesive layer 38 is removed from the pre-underfill layer 36 as shown. The wafer 30 can be inverted prior to the removal step, as shown. The layer 38 can be removed using a peeling process. In one embodiment, a portion of bumps 32 are exposed following the removal of layer 38.

Figure 14A:
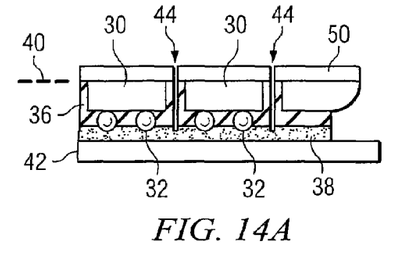
FIGS. 14A and 14B illustrate first and second options of a sixth step in the second exemplary method begun with FIG. 9, respectively, where the bumped wafer is singulated into a plurality of segments.
Figure 14B:
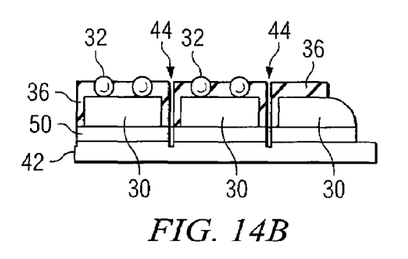

FIGS. 14A and 14B collectively illustrate the next, sixth step in the exemplary method begun with FIG. 9, for the case where adhesive layer 42 is disposed on adhesive layer 38, and for the case where adhesive layer 42 is applied directly to the coating 50, respectively. In the case of layer 38 to layer 42 adhesion, FIG. 14A illustrates the dicing saw process of forming saw cuts 44 to correspond with each of the filled grooves 34 of the bumped wafer 30. The cuts 44 can be formed with a dicing saw, or with similar manufacturing tool. As shown in FIG. 7A, the cuts extend to a portion of the layer 38. Layer 42 is left uncut so as to collectively retain individual cut segments of wafer 30 and to continue to provide structural support as the segments of wafer 30 are moved.

Similarly, FIG. 14B illustrates the sawing process for the case where adhesive layer 42 is applied directly to the coating 50. Cuts 44 are oriented to correspond with each of the plurality of filled grooves 34 of the bumped wafer 30. The cuts 44 extend into a portion of layer 42, but do not cut through the layer entirely. Again, layer 42 continues to provide structural support and collectively holds the segments of wafer 30 in place.

Figure 15A:
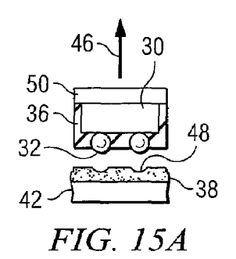
FIG. 15A illustrates a first option of a seventh step in the second exemplary method begun with FIG. 9, where a die attach process removes a bump from the bumped wafer segment.

Turning to FIG. 15A, a die attach process is shown in the case where layers 38 and 42 are directly attached. The die attach process can proceed using tools and processes known in the art. An individual segment of the plurality of segments of wafer 30 are shown for conceptual purposes of illustration. The segment 30 is lifted as denoted by arrow 46 from the adhesive layers 38 and 42. The bumps 32 are protected by layers 38 and 42 prior to the die attach process, which leaves behind void 48 in the layer 38.

Figure 15B:
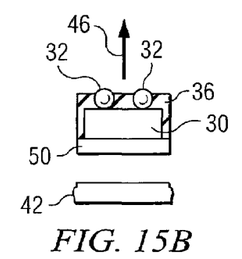
FIG. 15B illustrates a second option of the sixth step in the second exemplary method begun with FIG. 9, where a chip attach process removes the bumped wafer segment from the second adhesive layer.

In FIG. 15B, a chip attach process is shown which again lifts a segment of the bumped wafer 30 as denoted by arrow 46 to separate the segment from the adhesive layer 42.

Figure 16A:
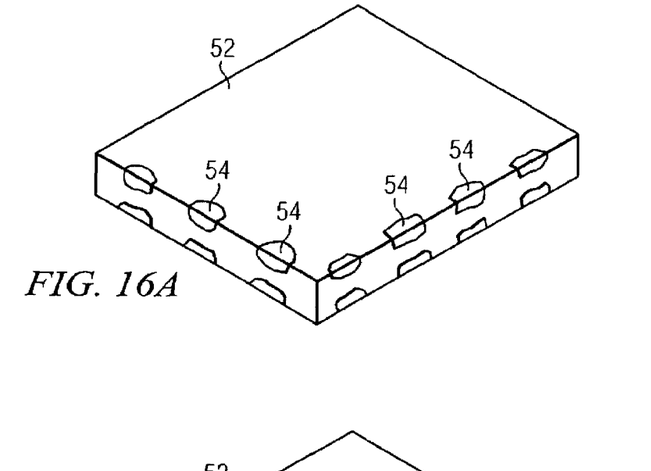
FIG. 16A conceptually illustrates a bumped wafer structure having backside chipping deficiencies.
Figure 16B:
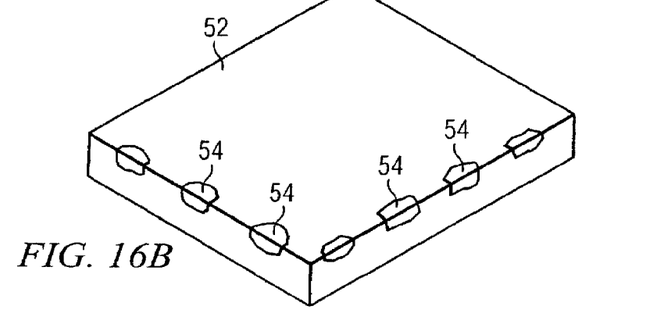
FIG. 16B conceptually illustrates a bumped wafer structure having markedly less backside chipping deficiencies.

Turning to FIG. 16A, a conceptual illustration of a wafer 52 is shown. The wafer 52 is prone to breakage and backside chipping 54 as indicated. In contrast, FIG. 16B illustrates the same wafer 52 exhibiting markedly less chipping 54 and is less prone to breakage. Backside chipping can be eliminated. A higher chip strength can be realized. Finally, wafer breakage and warping can be reduced.

Pre-underfill layer 36 can vary in thickness to suit a particular application. In some cases, the thickness of layer 36 can be so thick as to cause bumps 32 to be covered prior to a die attachment or chip attachment process. However, in those cases, a die can be attached to the bumped wafer 30 using a thermal pressure technique. In other cases, the thickness of layer 36 is such as to expose a portion of the bumps 32.

Figure 17A:
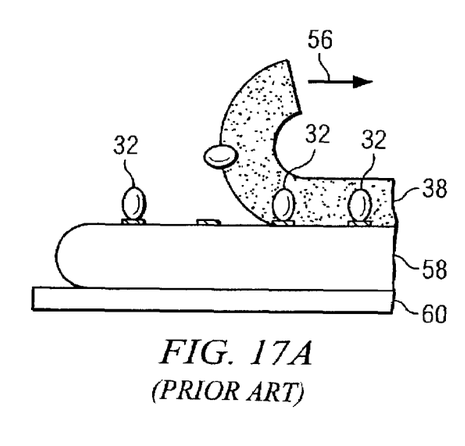
FIG. 17A illustrates an exemplary prior art drawback resulting from peeling of conventional underfill layer.

FIG. 17A illustrates shortcomings of a prior art method of peeling adhesive tape 39 from a bumped wafer 58 and layer 60. As shown, during a tape peeling process as denoted by arrow 56, the bumped wafer 58 has a risk of a ball 32 being pulled away from wafer 58. In addition to ball 32 being pulled away from wafer 58, the ball may be damaged and prove to be unworkable, as electrical signals do not flow through the ball 32 to an attached die.

Figure 17B:
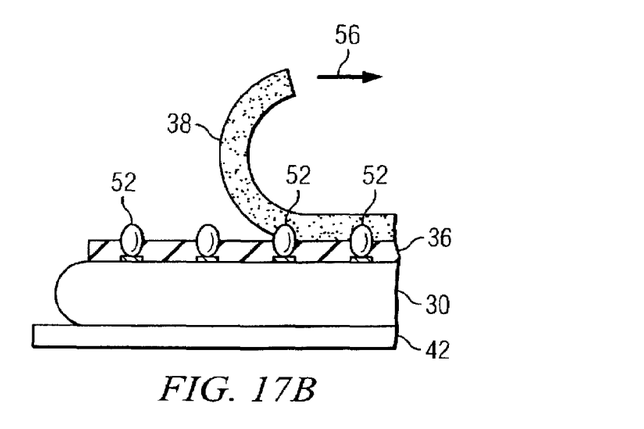
FIG. 17B conceptually illustrates benefits associated with a pre-underfill material upon removal of a conventional adhesive layer.

In contrast, FIG. 17B conceptually illustrates advantages of the pre-underfill material 36. A bumped wafer 30 is supported by adhesive layer 42. The adhesive layer 38 is removed from the pre-underfill layer 36 to expose a portion of bumps 52. As seen, the pre-underfill process coats about half of each bump ball 52, protects bump balls 52 and holds balls 52 securely in place during a chip attach or die attach process. Using a pre-underfill material 36 results in a smaller space or void after each chip attach, providing the same effect as a film attach process.

The pre-underfill layer 36 can be configured to be thinner than conventional underfill materials, partly because the physical characteristics of a thinner bumped wafer 30 make a thinner underfill possible. Bumped wafer 30 is thinner than a conventional bumped wafer structure, and therefore is lighter and exerts less force on the bumps 32 of wafer 30. The various physical characteristics of the pre-underfill layer 36 can be varied to suit a particular application, which can correspond to such factors as die size, gap height, bump density, and fillet size.

Figure 18:
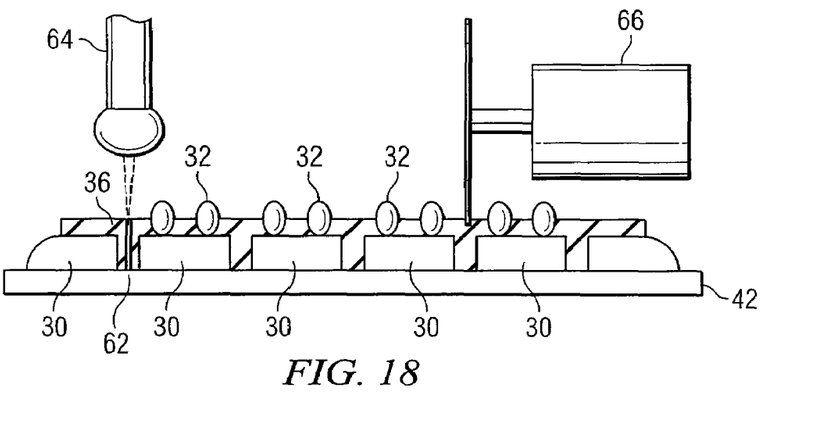
FIG. 18 conceptually illustrates benefits associated with thinner bumped wafer structures.

FIG. 18 conceptually illustrates further advantages of using utilizing a diamond blade or laser in a grooved bumped wafer system with pre-underfill material 36. A first cutting tool 64 is seen dicing segments of wafer 30 corresponding with each of the plurality of grooves originally formed in the bumped wafer structure 30. A second cutting tool 66 is illustrated for conceptual purposes. When wafer 30 thickness is made thinner, wafer 30 is more brittle and facilitates the saw process. Again, a higher chip strength can be realized, while wafer 30 breakage and warping is minimized.

Figure 19A:
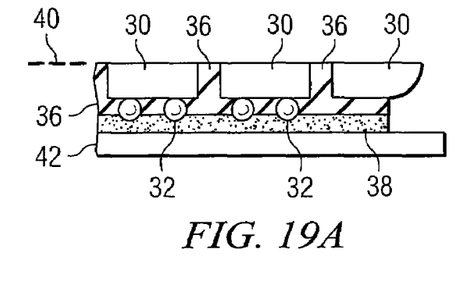
FIG. 19A illustrates a first step in a first exemplary method for a die attachment process.
Figure 19B:
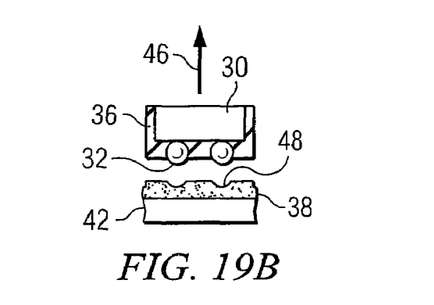
FIG. 19B illustrates a second step in a die attachment process.

FIG. 19A illustrates a first step of a die attach process. The second adhesive layer 42 is mounted to the first adhesive layer 38, as previously described, in a bumped wafer 30 structure. FIG. 19B illustrates a second step of the die attach process, where the individual segments of wafer 30 are pulled, as represented by arrow 46, from the first adhesive layer 38 and second adhesive layer 42. A further advantage of the pre-underfill layer 36 is that the wafer segment 30 is enclosed and protected on three sides, as indicated. The wafer segment 30 is protected from breakage during the die attach process on each of the three sides by the pre-underfill layer 36.

Figure 20A:
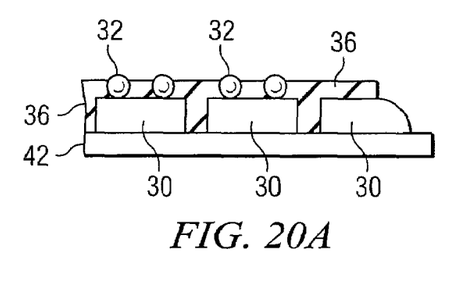
FIG. 20A illustrates a first step in a chip attachment process.
Figure 20B:
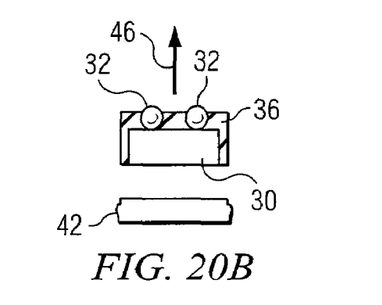
FIG. 20B illustrates a second step in a chip attachment process.

FIG. 20A illustrates a first step of a chip attach process. As opposed to the step depicted in FIG. 19A, wafer 30 is inverted and the second adhesive layer is mounted to the back side of the wafer. The first adhesive layer 38 is removed to expose a portion of the bumps 32 as seen. FIG. 20B illustrates a second step of the chip attach process, wherein the individual segments of wafer 30 are pulled away from the second adhesive layer 42, represented by arrow 46. The individual segments of wafer 30 are protected on three sides by the pre-underfill material 36 as indicated.

In each of the two options, a higher die strength is realized by wrapping the chip 30 with the pre-underfill material. Again, the pre-underfill material protects the segments of wafer 30 from cracking or breakage during subsequent chip attach or die attach processes.

Figure 21:
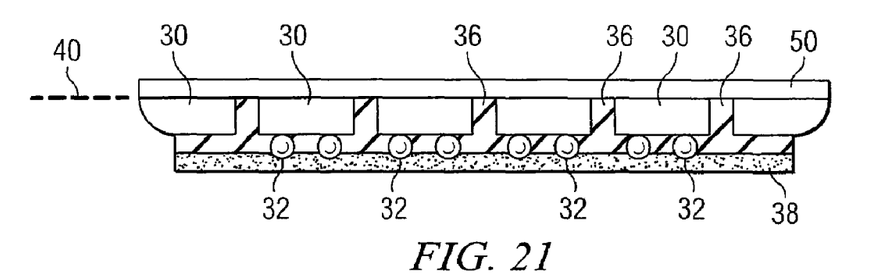
FIG. 21 conceptually illustrates the application of a coating over a backside of a bumped wafer structure.

FIG. 21 illustrates an additional embodiment, as previously described, where a coating 50 is mounted over a back surface of wafer 30 as indicated. The backside coating 50 provides for higher strength dies. Here again, various materials and methods can be used to form the coating 50, including use of polyimide (Pi), thermoplastic resin, and conventional underfill materials, and by using such techniques as spin coating and/or screen printing processes.

Figure 22A:
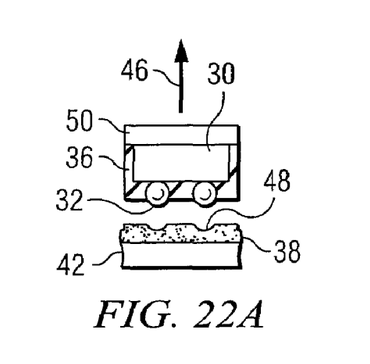
FIG. 22A illustrates a die attachment process performed incorporating a backside coating.

FIG. 22A illustrates a backside coated wafer in a die attach process, depicting the removal of an individual segment of wafer 30 from the adhesive layers 38 and 42. The die 30 is protected on three sides with the pre-underfill material 36. The backside of the die is further protected and enhanced with coating 50.

Figure 22B:
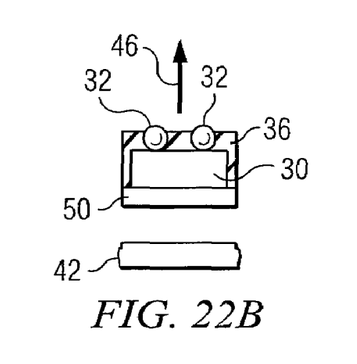
FIG. 22B illustrates a chip attachment process performed incorporating a backside coating.

Similarly, FIG. 22B illustrates a backside coated wafer in a chip attach process, depicting the removal of an individual segment of wafer 30 from the second adhesive layer 42. The die 30 is protected on three sides with the pre-underfill material 36, and further protected and enhanced with coating 50 as seen.

Use of grooved bumped wafer structures 30 as previously described, before a backgrinding process, which have been further enhanced with the use of a pre-underfill material 36 as previously described, allows for a thinner bumped wafer product, i.e., less than 100 um, which is less prone to cracking, breakage, and warping. In addition, resulting dies and chips are protected, and strengthened, for subsequent processing through die attach and chip attach processes through the use of pre-underfill material 36 and coating 50. Finally, bumps 32 are protected from damage, which would conventionally result from an adhesive tape removal.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of forming a semiconductor device, comprising:
   providing a bumped wafer;
   forming a plurality of grooves in an active surface of the bumped wafer;
   disposing a pre-underfill layer over the active surface, filling the plurality of grooves;
   laminating a first adhesive layer to the pre-underfill layer, and grinding a back surface of the bumped wafer;
   disposing a coating over the back surface of the bumped wafer;
   mounting a second adhesive layer to the coating and peeling off the first adhesive layer from the active surface of the bumped wafer, or mounting the second adhesive layer to the first adhesive layer; and
   singulating the bumped wafer into a plurality of segments by cutting the bumped wafer along the plurality of grooves.

2. The method of claim 1, further including, if the second adhesive layer is mounted to the first adhesive layer, using a die attach process to remove a first segment of the plurality of segments from the first adhesive layer.

3. The method of claim 1, further including, if the second adhesive layer is mounted to the coating, using a chip attach process to remove a first segment of the plurality of segments from the second adhesive layer.

4. The method of claim 1, wherein the bumped wafer is inverted a first instance to grind the back surface.

5. The method of claim 4, wherein the bumped wafer is inverted a second instance to peel the first adhesive layer from the active surface of the bumped wafer.

6. The method of claim 1, wherein the pre-underfill material includes a polyimide (Pi) material or a thermoplastic resin material.

7. The method of claim 1, wherein the first or second adhesive layer is deposited using a spin coating, screen printing, or lamination method.

8. The method of claim 1, wherein the coating is deposited using a spin coating, screen printing, or lamination method.

9. A method of manufacturing a semiconductor device, comprising:
   providing a bumped wafer having a plurality of grooves formed in an active surface of the bumped wafer;
   providing a pre-underfill layer disposed over an active surface, filling the plurality of grooves;
   providing a coating disposed over a back surface of the bumped wafer;
   providing a first adhesive layer mounted to the pre-underfill layer; and
   providing a second adhesive layer mounted to the coating, or mounted to the first adhesive layer.

10. The method of manufacture of claim 9, wherein the bumped wafer is singulated into a plurality of segments by cutting the bumped wafer along the plurality of grooves.

11. The method of manufacture of claim 10, wherein if the second adhesive layer is mounted to the first adhesive layer, a die attach process is used to remove a first segment of the plurality of segments from the first adhesive layer.

12. The method of manufacture of claim 10, wherein if the second adhesive layer is mounted to the coating, a chip attach process is used to remove a first segment of the plurality of segments from the second adhesive layer.

13. The method of manufacture of claim 9, wherein the pre-underfill material includes a polyimide (Pi) material or a thermoplastic resin material.

14. The method of manufacture of claim 9, wherein the first or second adhesive layer is deposited using a spin coating, screen printing, or lamination method.

15. The method of manufacture of claim 9, wherein the coating is deposited using a spin coating, screen printing, or lamination method.

16. A method of forming a semiconductor device, comprising:
   providing a wafer having an active surface with a plurality of solder bumps disposed on the active surface and a plurality of grooves formed to a depth in the active surface;
   disposing a pre-underfill layer over the active surface, filling the plurality of grooves and partially coating the solder bumps so that about half of each solder bump remains uncoated;
   laminating a first adhesive layer to the pre-underfill layer;
   grinding a back surface of the bumped wafer to the depth of the plurality of grooves;
   disposing a coating over the back surface of the bumped wafer;
   mounting a second adhesive layer to the coating;
   peeling off the first adhesive layer from the active surface of the bumped wafer;
   singulating the bumped wafer into a plurality of segments; and
   separating each segment from the second adhesive layer using a die attach process.

17. The method of claim 16 wherein the singulating step further comprises cutting the bumped wafer along each of the grooves so that each cut extends through the pre-underfill layer and the coating.

18. The method of claim 17 wherein each cut extends into a portion of the second adhesive layer.

19. A method of forming a semiconductor device, comprising:
   providing a wafer having an active surface with a plurality of solder bumps disposed on the active surface and a plurality of grooves formed to a depth in the active surface;
   disposing a pre-underfill layer over the active surface, filling the plurality of grooves and partially coating the solder bumps so that about half of each solder bump remains uncoated;
   laminating a first adhesive layer to the pre-underfill layer;
   grinding a back surface of the bumped wafer to the depth of the plurality of grooves;
   disposing a coating over the back surface of the bumped wafer;
   mounting a second adhesive layer to the first adhesive layer;
   singulating the bumped wafer into a plurality of segments; and
   separating each segment from the first and second adhesive layers using a die attach process.

20. The method of claim 19 wherein the singulating step further comprises cutting the bumped wafer along each of the grooves so that each cut extends through the pre-underfill layer and the coating.

21. The method of claim 20 wherein each cut extends into a portion of the first adhesive layer.

* * * * *